United States Patent [19]

Hata et al.

[11] 4,404,546
[45] Sep. 13, 1983

[54] DIGITAL-TO-ANALOG CONVERTER

[75] Inventors: Ikuro Hata, Hiratsuka; Masashi Takeda, Isehara, both of Japan

[73] Assignee: Sony Corporation, Tokyo, Japan

[21] Appl. No.: 329,698

[22] Filed: Dec. 11, 1981

[30] Foreign Application Priority Data

Dec. 15, 1980 [JP] Japan .................. 55-176888

[51] Int. Cl.³ ........................... H03K 13/02
[52] U.S. Cl. ........................... 340/347 DA
[58] Field of Search ............ 340/347 DA, 347 AD, 340/347 M, 347 MT; 324/99 D

[56] References Cited

U.S. PATENT DOCUMENTS 3,646,545  2/1972  Maydan ............ 340/347 DA
3,999,181 12/1976  Hirsch ............. 340/347 DA
4,258,355  3/1981  Edwards .......... 340/347 DA

FOREIGN PATENT DOCUMENTS 1249761 10/1971 United Kingdom .
1304157  1/1973 United Kingdom .
1503530  3/1978 United Kingdom .

Primary Examiner—C. D. Miller
Attorney, Agent, or Firm—Lewis H. Eslinger; Alvin Sinderbrand

[57] ABSTRACT

An integrating digital-to-analog converter circuit includes an operational-amplifier based integrator, a plurality of constant current sources each providing constant current at a respective different level, and a plurality of switches each associated with a respective current source for coupling the same to the integrator. A plurality of digital counters are arranged to hold a predetermined portion of an n-bit digital word loaded therein and to count clock pulses until their contents reach a predetermined count. At those times, a carry pulse is generated in each such digital counter and the associated switch is opened to cut off the associated current source. Such a digital-to-analog converter circuit can convert data words of relatively high bit length without the need for an excessively high frequency clocking signal.

14 Claims, 19 Drawing Figures

FIG. 1 PRIOR ART
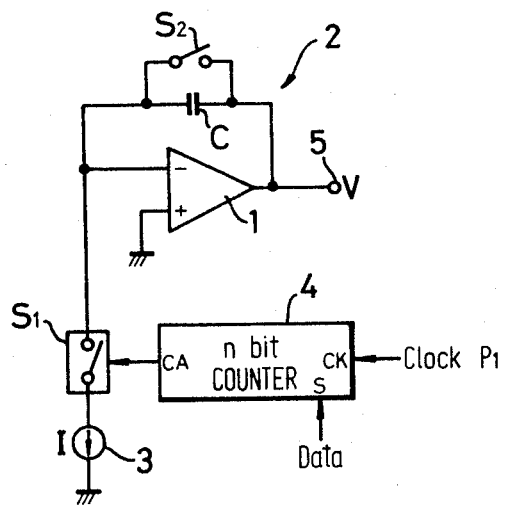
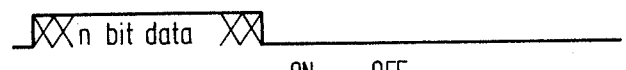
FIG.2A Data set
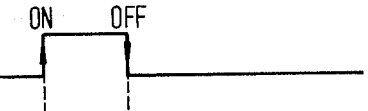
FIG.2B Switch S2
FIG.2C Start signal
FIG.2D Clock P1
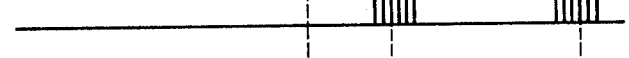
FIG.2E Current I
FIG.2F Carry CA
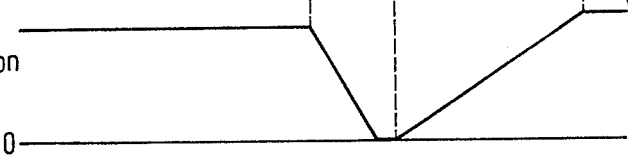
FIG.2G D/A conversion output

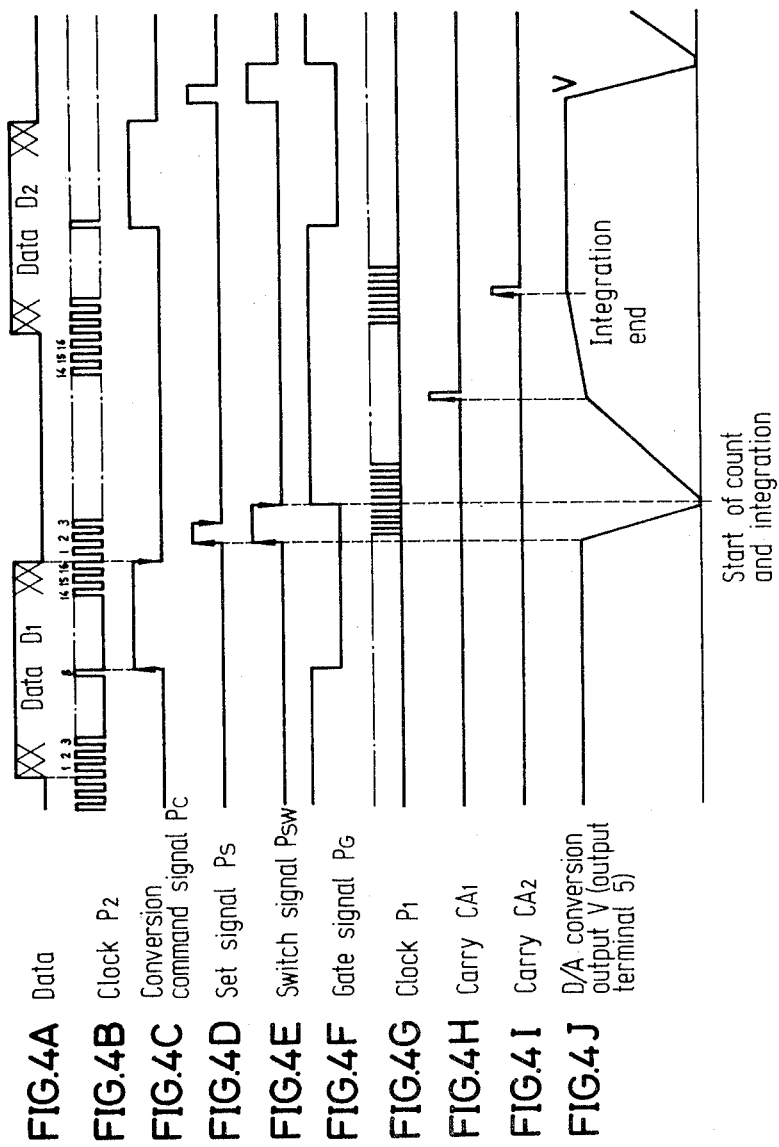

DIGITAL-TO-ANALOG CONVERTER

BACKGROUND OF THE INVENTION

1. Field of the Invention

This invention relates to integrating digital-to-analog (DA) converters, and is particularly directed to a DA converter capable of accurately converting data words of high bit length while avoiding the need for an excessively high clock signal frequency.

2. Description of the Prior Art

A conventional integrating DA converter is formed of an operational amplifier and a capacitor for integrating current from a constant current source. An n-bit counter is loaded with n-bit data words to be converted, and provides a carry signal to open a current switch disposed between with the constant current source and the operational amplifier.

At the beginning of an integrating cycle, another switch associated with the capacitor is actuated and the latter is discharged to make the output voltage initially zero. Then, the counter begins counting clock pulses as the capacitor begins charging. When the counter reaches a predetermined count, usually $2^n$, a carry is produced and is used to open the current switch and end the charging of the capacitor. At this time, the output of the operational amplifier provides an output voltage corresponding to the analog value of the n-bit word fed into the counter.

This output voltage is the integral of the charging current with respect to the counting time, that is, $$V = (1/C) \int I dt.$$

As the current is supplied by a constant current source, the maximum output voltage that can be reached for any n-bit word is just proportional to the to the maximum counting time of the counter, that is, $(2^n - 1)$ times one clocking signal period.

In a typical PCM audio system the PCM data words have a bit length of $n = 16$ and these words occur at a sampling frequency of about 50 KHz (i.e., the system has a sampling period of 20 μsec). Accordingly, to operate a conventional integrating DA converter supplied with such a PCM audio signal would require a clocking frequency at least $(2^n - 1)$ times the sampling frequency. Under the typical conditions mentioned above, i.e., with $n = 16$ and a sampling frequency of 50 KHz, the clocking frequency would need to be about 3.3 GHz.

It is apparent that this clocking frequency is excessively high, and could not provide a realistic parameter for design of a DA converter for use in a PCM audio system. Furthermore, it would not be possible to construct a straightforward and reliable integrating DA converter as a monolithic integrated circuit (IC) if it were necessary to use a 3.3 GHz clocking signal.

OBJECTS AND SUMMARY OF THE INVENTION

Accordingly, it is an object of this invention to provide a DA converter which can convert data words of relatively high bit length without the need for an excessively high frequency clocking signal.

It is another object of this invention to provide an integrating-type DA converter suitable for construction as a monolithic integrated circuit.

It is yet another object of this invention to provide a DA converter which can accurately convert data of high bit length.

According to an aspect of this invention, a digital to analog converter circuit is provided for converting digital words of n bits into a corresponding analog level. The circuit comprises an integrator having an input to which charging current is applied and an output from which the analog level is derived; a plurality of constant current sources each providing current at a different respective predetermined level; a plurality of switches each associated with a respective one of the current sources for coupling the same to the integrator to provide charging current thereto; a plurality of digital counters each corresponding to a respective one of the switches and holding a predetermined portion of the n bits of a digital word loaded therein, the digital counters in the aggregate holding all of the n bits, each such counter being coupled to its respective switch to provide a switching signal when its contents reach a predetermined count; a clock generator providing clocking signals to the digital counters; and a bit dividing circuit, such as a pair of shift registers arranged in tandem, for receiving the n-bit digital words, dividing the same into a plurality of fragments, and loading such fragments into respective ones of the counters. The circuit is so configured that when these fragments have been loaded into the counters, the counters begin counting the clocking signals and the switches are closed for supplying the charging current to the integrator, and when the contents of each of the counters reaches the predetermined count, that counter provides its switching signal in the sense to open its associated switch and cut off the charging current from the respective current source.

A latch circuit can be provided, in association with the counter containing the fragment containing the most significant bits of each n-bit data word, for synchronizing the switching signal to its respective switch with the clocking signals provided to the digital counters. This minimizes any conversion error due to timing errors in the opening of the various switches.

The above and other objects, features, and advantages of this invention will become apparent from the ensuing detailed description of a preferred embodiment, which is to be considered in connection with the accompanying drawings.

BRIEF DESCRIPTION OF THE DRAWINGS

FIG. 1 is a circuit diagram of a conventional integrating digital-to-analog converter.

FIGS. 2A to 2G are charts of wareforms appearing in the conventional converter of FIG. 1, and are useful in explaining its operation.

FIGS. 4A to 4J are charts of waveforms appearing in the embodiment of FIG. 3, and are useful in explaining its operation.

DETAILED DESCRIPTION OF A PREFERRED EMBODIMENT

Figure 3:
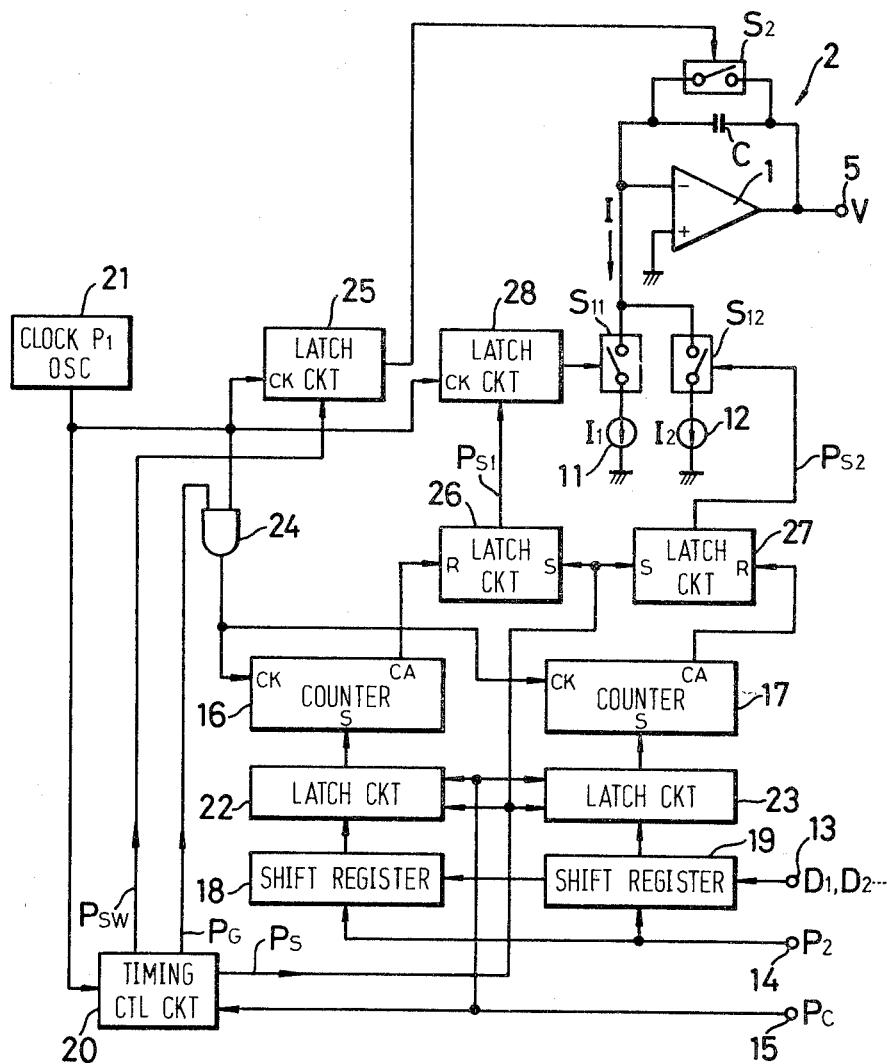
FIG. 3 is a circuit diagram of a preferred embodiment of the integrating digital-to-analog converting circuit of this invention.

For the purpose of explaining the background of this invention and for emphasizing its advantages, a conventional integrating-type digital-to-analog (DA) converter will first be explained with reference to FIG. 1.

A conventional integrating type DA converter includes an integrator 2 formed of an operational amplifier 1 and a capacitor C connected between an inverting input of the operational amplifier 1 and the output thereof. A discharge switch $S_2$ is connected in parallel with the capacitor C, and the non-inverting input of the operational amplifier 1 is grounded.

A constant current source 3 is coupled to the integrator 2 by means of a current switch $S_1$ and supplies charging current I to the integrator 2 thereby charging the capacitor C. A n-bit counter 4 has a data input S into which n-bit data words are set, a clock input terminal CK receiving clock pulses $P_1$, and a carry terminal CA coupled to the switch $S_1$.

An analog output terminal 5 is coupled to the output of the operational amplifier 1.

The operation of the conventional integrating type DA converter can be explained with reference to the waveforms of FIGS. 2A through 2G. First, an n-bit data word (FIG. 2A) is set into the counter 4. Then, as shown in FIG. 2B, the switch $S_2$ is closed to discharge the capacitor C, so that the voltage at the output terminal 5 becomes zero. After this, a start signal, as shown in FIG. 2C, is applied to the switch $S_1$ to close the same, and is also applied to the counter 4 so that the counter 4 begins counting the clock pulses $P_1$ (FIG. 2D) applied thereto. The counter 4 counts upward from the initial value corresponding to the n-bit data word. As soon as the switch $S_1$ is closed, the constant charging current I (FIG. 2E) flows to the integrator 2 to charge the capacitor C thereof. In consequence, the voltage V at the output terminal 5 increases.

When the contents of the counter 4 reach a value of $2^n$, a carry CA is generated, as shown in FIG. 2F, to open the switch $S_1$, thereby stopping the charging of the capacitor C. With this integrating DA converter, the constant current I flows for a period of time T (FIG. 2D) extending from the time that the counter commences counting the clock pulses $P_1$ until the carry signal CA is produced. Consequently, the capacitor C is charged to a voltage V (FIG. 2G) whose magnitude is proportional to the charging time (i.e., counting time) T.

The integrated voltage on a capacitive integrator can be generally expressed by the following equation:

$$V = (1/C) \int I dt \quad (1)$$

Because the current I is a constant, this voltage can be expressed $$V = (1/C) I \times T \quad (2)$$

The maximum value $T_{max}$ of the counting time T of the counter 4 can be expressed:

$$T_{max} = (2^n - 1)\tau_1 \quad (3)$$

where $\tau_1$ represents the period of the clock pulses $P_1$.

Consequently, the maximum value $V_{max}$ of the voltage V can be calculated from the relation (2) as:

$$V_{max} = (I/C)(2^n - 1)\tau_1 \quad (4)$$

If it is attempted to apply this conventional integrating-type DA converter to a digital audio system, problems arise because of the extremely high clock pulse frequency which is required.

More specifically, in a typical PCM audio system, analog audio signals are converted into PCM digital signal whose digital words have a bit length of 16 bits. Furthermore, a typical sampling period for such a PCM audio signal is about 20 μsec (corresponding to a sampling frequency of 50 KHz). In the above-described conventional DA converter, the period $\tau_1$ of the clock pulses $P_1$ would need to satisfy the following relation:

$$20 \, \mu sec \geq (2^{16} - 1)\tau_1 = 65535 \tau_1 \quad (5)$$

As is apparent, for a 16-bit audio signal, the clock period $\tau_1$ would need to be approximately 0.31 nsec, corresponding to a clock pulse frequency of 3.3 GHz. Of course, such a frequency would be excessively high, and would not provide a realistic design parameter for construction of the integrating DA converter as a monolithic integrated circuit (IC).

An improved integrating-type DA converting circuit according to this invention is shown in FIG. 3. Elements in common with the DA converter of FIG. 1 are identified with the same reference characters, and a detailed description thereof is omitted. In this embodiment, the charging current I for the capacitor C is provided through a pair of switches $S_{11}$ and $S_{12}$, each of which is coupled to a respective constant current source 11 and 12 providing constant currents $I_1$ and $I_2$. Also in this embodiment, the currents I and $I_2$ are selected in the ratio of $2^8:1$ (i.e., 256:1).

A data input 13 is connected to receive 16-bit data words $D_1$, $D_2$ (FIG. 4A), a data clock input 14 is coupled to receive data clock pulses $P_2$ (FIG. 4B), and a command signal input 15 is coupled to receive a conversion command signal $P_C$ (FIG. 4C). A first digital counter 16 and a second digital counter 17 are arranged to store the upper eight bits, i.e., more significant bits, of the data words $D_1$, $D_2$ and the lower eight bits, i.e., less significant bits thereof, respectively.

A pair of shift registers 18 and 19 are connected to receive the upper bits and lower bits, respectively, of these data words $D_1$, $D_2$. The data input 13 is coupled to a bit input of the lower-bit shift register 19, and an overflow output thereof is coupled to a bit input of the upper-bit shift register 18. The data clock input 14 is coupled to respective clock terminals of both shift registers 18 and 19.

A timing control circuit 20 has an input coupled to the command signal input 15 and another input connected to a clock pulse generator 21.

First and second latch circuits 22 and 23 are interposed between outputs of the respective shift registers 18 and 19 and data loading inputs S of the counters 16 and 17. These latches 22 and 23 each have a pair of latch input terminals, one of which is coupled to the command signal input 15 to receive the conversion command signal $P_C$ and the other of which is coupled to the timing control circuit 20 to receive a set signal $P_S$ (FIG. 4D) therefrom. An AND gate 24 has a pair of inputs, one of which is coupled to the timing control circuit 20 to receive a gate signal $P_G$ (FIG. 4F) therefrom, while the other thereof is connected to the clock pulse generator to receive high speed clock pulses $P_1$ (FIG. 4G). The output of the AND gate 24 is connected to clock input terminals CK of the counters 16 and 17.

A pair of latches 26 and 27 each have a set terminal S coupled to receive the set signal $P_S$ from the time controlling circuit 20, and also have a reset terminal R coupled to a carry output of the respective counters 16 and 17. These latches 26 and 27 provide latch output signals for actuating the switches $S_{11}$ and $S_{12}$, respectively. An additional latch 28 is coupled between the latch 26 and the switch $S_{11}$, and has a clock input terminal CK coupled to the clock pulse generator 21 to ensure that the switch $S_{11}$ is opened in synchronism with the high-speed clocking pulses $P_1$.

The timing control circuit 21 can be comprised of conventional elements, such as a counter, a latch circuit, logic gates, and the like.

The operation of the above-described embodiment can be explained with reference to the waveform charts of FIGS. 4A through 4J.

Pulse code modulated data words, $D_1$, $D_2$ each having a bit length of 16 bits, are applied to the data input terminal 13, and are marched through the shift register 19 into the shift register 18 in response to the data clock pulses $P_2$ shown in FIG. 4B. The conversion command signal $P_C$ shown in FIG. 4C rises at the central bit (here the eighth bit) of the data words $D_1$, $D_2$, and falls at the last bit (sixteenth bit) thereof. The timing control circuit 21 is reset in response to the rising edge of the conversion command signal $P_C$ and then produces the signals $P_S$, $P_{SW}$, and $P_G$ at times determined by the counting of the clock signal pulses $P_1$ from the clock pulse generator 21.

In response to the falling edge of the conversion command signal $P_C$, the latches 22 and 23 are actuated to store the contents of the counters 18 and 19. Thereafter, in response to the set signal $P_S$, the upper bits and lower bits of the data words $D_1$, $D_2$ are transferred from the respective latches 22 and 23 to the counters 16 and 17.

At the same time, as shown in FIG. 4E, the switch signal $P_{SW}$ is provided to the latch 25 which closes the discharging switch $S_2$ during the time that the switch signal $P_{SW}$ is high.

At the time that the switch signal $P_{SW}$ falls, the gate signal $P_G$ rises, as shown in FIG. 4F, and remains high until the rising edge of the next successive conversion command signal $P_C$. While the gate signal $P_G$ is high, the AND gate 24 supplies the high speed clock pulses $P_1$ (FIG. 4G) to the counters 16 and 17.

Meanwhile, in response to the falling edge of the set signal $P_S$, the latch circuits 26 and 27, are set, thereby closing the respective switches $S_{11}$ and $S_{12}$.

The counters 16 and 17 thus begin counting the high speed clock pulses $P_1$ from the time that the switch $S_2$ is opened. Then, as the current sources 11 and 12 supply current to charge the capacitor C, the counters 16 and 17 count the clocking pulses $P_1$. These counters 16 and 17 count from the values of the eight upper bits and eight lower bits, respectively, until their respective contents equal $2^8$, at which times the counters 16 and 17 provided respective carry signals $CA_1$ (FIG. 4H) and $CA_2$ (FIG. 4I).

In this example, it is assumed that the lower eight bits (i.e., bits 9 to 16) of the particular data word $D_1$ have a greater value than the upper eight bits (i.e., bits 1 through 8) thereof, so that the carry signal $CA_1$ occurs before the carry signal $CA_2$.

Therefore, during the initial charging of the capacitor C, the current I flowing while the counters 16 and 17 accumulate is the sum of the constant currents $I_1$ and $I_2$, i.e., $I=I_1+I_2$. During this time the voltage V at the output terminal 5 rises, as shown in FIG. 4J. When the contents of the first counter 16 reach $2^8$, the carry signal $CA_1$ is furnished to the latch 26 to reset the same, so that, in response, the switch $S_{11}$ is opened. Thereafter, charging of the capacitor C continues with the current $I=I_2$. During this time, the voltage V rises relatively slowly. When the count value of the second counter 17 also reaches $2^8$, the carry signal $CA_2$ is provided to reset the latch 27, thereby opening the switch $S_{12}$, and ending the integration operation. The voltage V thus appearing at the output terminal 5 represents the analog value of the data word $D_1$.

When a subsequent data word $D_2$ is applied to the input terminal 13, a subsequent digital-to-analog conversion is executed in the same manner as described above.

The additional latch 28 is provided to minimize any error which might be caused by the timing errors in the opening of the switch $S_{11}$. Since the current $I_1$ is selected to be 256 times the current $I_2$, even a slight error in the timing of the opening and closing of the switch $S_{11}$, caused, for example, by variation in the switching time of the latch 26, can produce a significant error in the output voltage V. In order to resolve this problem, the latch 28 is included to be reset by the high speed clock pulses $P_1$, so that the output of the latch 26 is synchronized with the clock pulses $P_1$, and consequently, the opening of the switch $S_{11}$ is also synchronized therewith.

In other possible embodiments of this invention, the latch 26 can be arranged to be reset in synchronism with the high speed clock pulses $P_1$.

It is noted that the latch circuit 25, which opens the switch $S_2$ to begin the charging of the capacitor C, is also synchronized with the high speed clock pulses $P_1$ for the same reason of minimizing the effect of timing errors.

In the embodiment described above, 16-bit data words are divided into two segments, an upper eight bits and a lower eight bits. However, it is apparent that the input data words $D_1$, $D_2$ need not be divided into precise halves. More generally, and m upper bits of the n-bit input data words (where $n \geq m$) may be used as an upper word fragment, while the remaining (n−m) bits can be provided as one or more word fragments of less significant bits. The ration of the constant currents $I_1$ and $I_2$ will depend on the number (n−m) of lower bits. In the general case, the relationship (4) above may be rewritten as:

$$V_{max} = \frac{I_1}{C}(2^m - 1)\tau_1 + \frac{I_2}{C}(2^{n-m} - 1)\tau_1 \qquad (6)$$

Also, the currents $I_1$ and $I_2$ are in general selected in the relationship $I_1 = 2^{n-m} \times I_2$, and the relation (6) can be rewritten as:

$$V_{max} = \frac{I_2}{C}(2^n - 1)\tau_1 \qquad (7)$$

Therefore, digital-to-analog conversion is carried out with the same results as in the relationship (4) above, except that much lower clock frequencies can be used than with the conventional DA converter.

In practice, it is preferable to establish the value of m at the close to (n/2) to increase accuracy, and to minimize conversion time.

In this embodiment, where n=16 and m=8, and where the sampling period is 20 μsec so that the maximum stabilizing time for the conversion output voltage V is about 10 μsec, the clocking period $\tau_1$ of the high speed clock pulses $P_1$ should be selected to satisfy the relationship $10\ \mu sec > (2^8 - 1)\tau_1$.

Therefore, with this embodiment, the clock pulses $P_1$ can have a period $\tau_1 \leq 39$ nsec. In other words, the frequency of the clock pulses $P_1$ need only be about 25.5 MHz which is about 1/256 the clock pulse frequency required for the conventional DA converter shown in FIG. 1 (approximately 3.3 GHz). The relatively lower clock pulse frequency of 2.5 MHz is quite workable, and can be achieved with a converter formed as a monolithic IC.

In this embodiment, the data words $D_1$, $D_2$ are divided into two eight-bit pieces. However, if the data words $D_1$, $D_2$ are divided into three or more segments, the requisite clock pulse period $\tau_1$ can be made still longer, and the frequency of the clocking pulses $P_1$ can be correspondingly lowered.

While an illustrative embodiment of this invention has been described in detail hereinabove with reference to the accompanying drawings, it is to be understood that this invention is not limited to that precise embodiment, and that many variations and modifications can be effected therein by one skilled in the art without departing from the scope and spirit of the invention as defined in the appended claims.

What is claimed is:

1. A digital to analog converter circuit for converting digital words of n bits into a corresponding analog level, comprising
    integrating means having an input to which charging current is applied and an output from which said analog level is derived;
    a plurality of current sources each providing a constant current at a different respective predetermined level;
    a plurality of switching means each associated with a respective one of said current sources for coupling the same to said integrating means to provide charging current thereto;
    a plurality of digital counters each corresponding to a respective one of said switching means and holding a predetermined portion of said n bits, the digital counters in the aggregate holding all said n bits, each said counter being coupled to its respective switching means to provide a switching signal when the contents thereof reach a predetermined count;
    clock generator means providing clocking signals to said digital counters; and
    means for receiving said n-bit digital words, dividing the same into a plurality of fragments, and loading each such fragment into a respective one of said counters;
    the circuit being so configured that when said fragments have been loaded into said counters, said counters begin counting said clocking signals and said switching means are closed for supplying said charging current to said integrating means, and when the contents of each of said counters reaches said predetermined count, that counter provides said switching signal to open the associated switching means to cut off the charging current from the respective current source.

2. A digital to analog converter circuit according to claim 1, wherein the predetermined levels for the respective current sources are related to each other corresponding to the bit significance of the associated fragments of the n-bit words to be loaded into the respective counters.

3. A digital to analog converter circuit according to claim 1, wherein the predetermined levels for the current sources associated with the counters containing successive fragments of said n-bit word are in a ratio of $2^{n-m}$ where m is the number of bits in the most significant fragment.

4. A digital to analog converter circuit according to claim 1, wherein each said fragment of said n-bit word contains substantially the same number of bits.

5. A digital to analog converter circuit according to claim 1, wherein each said switching means includes a switch circuit coupled between the respective current source and said integrating means, and latching means providing a latching signal for closing and opening the associated switch circuit and having a set terminal coupled to receive a set signal provided thereto in correspondence to the loading of said counters and a reset terminal coupled to receive a carry signal from the associated digital counter.

6. A digital to analog converter circuit according to claim 5, wherein at least one of said switching means includes a further latching circuit providing the associated latching signal to the respective switch circuit in synchronism with said clocking signals.

7. A digital to analog converter circuit according to claim 6, wherein said at least one of said switching means is that associated with the digital counter holding the fragment of said n-bit word having the most significant bits thereof.

8. An digital to analog converter circuit for converting digital words of n bits into a corresponding analog level, comprising
    integrating means having an input to which a charging current is applied and an output from which said analog level is derived;
    a first and a second current source each providing a constant current at a different respective predetermined level;
    first and second switching means associated with said first and second current sources, respectively, for coupling the same to said integrating means to provide charging current thereto;
    a first and a second digital counter respectively associated with said first and second switching means, each holding substantially half of said n bits, the digital counters in the aggregate holding all said n bits, each said counter being coupled to its respective switching means to provide a switching signal when the contents thereof reach a predetermined count;
    clock generator means providing clocking signals to said digital counters; and
    means for receiving said n-bit digital words, dividing the same into an upper m bits and a lower n−m bits, m being an integer substantially half the value n, loading said upper m bits into said first counter, and loading said lower n−m bits into said second counter;
    the circuit being so configured that when said upper and lower bits have been loaded into said counters, the latter begin counting said clocking signals and said first and second switching means are closed for supplying said charging current to said integrating means, and when the contents of each of said counters reaches its predetermined count, that counter provides said switching signal to open the associated switching means to cut off the charging current from the respective current source.

9. A digital to analog converter circuit according to claim 8, wherein the predetermined levels for said first and second current sources are provided in the ratio of substantially $2^m$.

10. A digital to analog converter circuit according to claim 8, wherein each said switching means includes a switch circuit coupled between the respective current source and said integrating means, and latching means providing a latching signal for closing the associated switch circuit and having a set terminal coupled to receive a set signal provided thereto in correspondence to the loading of said counters and a reset terminal coupled to receive a carry signal from the associated digital counter.

11. A digital to analog converter circuit according to claim 10, wherein said first switching means further includes a further latching circuit between the associated first-mentioned latching circuit and the associated switch circuit to provide said latching signal thereto in synchronism with said clocking signals.

12. A digital to analog converter circuit according to claim 8, wherein said means for receiving said n-bit digital words includes first and second shift registers arranged in tandem with the digital words being applied to an input of said second shift register, and an overflow of said second shift register being coupled to an input of said first register, such that said first register holds said m upper bits and said second shift register holds said n−m lower bits.

13. A digital to analog converter circuit according to claim 12, wherein said means for receiving said n-bit digital words further includes first and second latch means coupled between the respective shift registers and the first and second digital counters.

14. A digital to analog converter circuit according to claim 13, further comprising timing control circuitry providing a start signal, when each said n-bit word has been entered into the first and second shift registers, to latch the first and second latch means and also to close said first and second switch means.

* * * * *